(12) United States Patent
Park

(10) Patent No.: US 9,160,037 B2
(45) Date of Patent: Oct. 13, 2015

(54) APPARATUS AND METHOD FOR ESTIMATING AVAILABLE TIME OF BATTERY

(75) Inventor: Kyu-Ha Park, Seoul (KR)

(73) Assignee: LG Chem, Ltd., Seoul (KR)

( * ) Notice: Subject to any disclaimer, the term of this patent is extended or adjusted under 35 U.S.C. 154(b) by 534 days.

(21) Appl. No.: 13/606,922

(22) Filed: Sep. 7, 2012

(65) Prior Publication Data

US 2012/0326724 A1    Dec. 27, 2012

Related U.S. Application Data

(63) Continuation of application No. PCT/KR2011/010139, filed on Dec. 27, 2011.

(30) Foreign Application Priority Data

Jan. 5, 2011  (KR) .................. 10-2011-0001052
Dec. 27, 2011  (KR) .................. 10-2011-0142968

(51) Int. Cl.
```
G01N 27/416    (2006.01)
H01M 10/44     (2006.01)
B60L 3/12      (2006.01)
B60L 11/18     (2006.01)
```
(Continued)

(52) U.S. Cl.
CPC ............... *H01M 10/44* (2013.01); *B60L 3/12* (2013.01); *B60L 11/1805* (2013.01); *B60L 11/1861* (2013.01); *G01R 31/3648* (2013.01); *H01M 10/48* (2013.01); *B60L 2240/549* (2013.01); *B60L 2250/16* (2013.01); *B60L 2260/52* (2013.01); *B60L 2260/54* (2013.01);
*G01R 31/3606* (2013.01); *Y02T 10/705* (2013.01); *Y02T 10/7005* (2013.01); *Y02T 10/7044* (2013.01)

(58) Field of Classification Search
CPC .......... G01R 31/3648; G01R 31/3627; G01R 31/3662; G01R 31/3631; G01R 31/3686; G01R 31/3682; Y02E 60/12; H01M 6/505; H01M 10/488
USPC ........................................................ 324/426
See application file for complete search history.

(56) References Cited

U.S. PATENT DOCUMENTS

| | | | |
|---|---|---|---|
| 2003/0057922 A1* | 3/2003 | Odaohhara et al. | ........... 320/164 |
| 2004/0070511 A1 | 4/2004 | Kim | |
| 2007/0090803 A1 | 4/2007 | Yun et al. | |

(Continued)

FOREIGN PATENT DOCUMENTS

| | | |
|---|---|---|
| JP | 2001-245422 A | 9/2001 |
| JP | 2010-111276 A | 5/2010 |

(Continued)

*Primary Examiner* — Arun Williams
(74) *Attorney, Agent, or Firm* — Birch, Stewart, Kolasch & Birch, LLP

(57) ABSTRACT

Disclosed are an apparatus and method for estimating an available time of a battery relatively accurately in consideration of a driving pattern of a user. The apparatus for estimating an available time of a battery includes a current measuring unit for measuring an output current of the battery, a SOC estimating unit for estimating SOC (State Of Charge) of the battery, and a controller for estimating an available time of the battery by using a measured current value obtained by the current measuring unit, an estimated SOC value obtained by the SOC estimating unit and an entire capacity of the battery.

13 Claims, 2 Drawing Sheets

(51) Int. Cl.
*H01M 10/48* (2006.01)
*G01R 31/36* (2006.01)

(56) References Cited

U.S. PATENT DOCUMENTS

| | | |
|---|---|---|
| 2010/0194339 A1 | 8/2010 | Yang et al. |
| 2010/0271035 A1 | 10/2010 | Heo et al. |
| 2010/0280700 A1* | 11/2010 | Morgal et al. .................. 701/29 |
| 2010/0280777 A1 | 11/2010 | Jin et al. |
| 2011/0218703 A1 | 9/2011 | Uchida |
| 2011/0234167 A1* | 9/2011 | Kao et al. ...................... 320/132 |

FOREIGN PATENT DOCUMENTS

| | | |
|---|---|---|
| JP | 2010-175484 A | 8/2010 |
| JP | 2010-183831 A | 8/2010 |
| JP | 2010-230499 A | 10/2010 |
| KR | 10-2004-0033220 A | 4/2004 |
| KR | 10-2006-0073295 A | 6/2006 |
| KR | 10-2007-0043150 A | 4/2007 |
| KR | 10-2009-0077657 A | 7/2009 |
| WO | WO 2010/062141 A2 | 6/2010 |

* cited by examiner

APPARATUS AND METHOD FOR ESTIMATING AVAILABLE TIME OF BATTERY

CROSS-REFERENCE TO RELATED APPLICATION

This application is a continuation of PCT/KR2011/010139 filed on Dec. 27, 2011, which claims priority under 35 U.S.C. 119(a) to Patent Application No. 10-2011-0001052 filed in Republic of Korea on Jan. 5, 2011 and Patent Application No. 10-2011-0142968 filed in Republic of Korea on Dec. 27, 2011, all of which are hereby expressly incorporated by reference into the present application.

TECHNICAL FIELD

The present disclosure relates to a technique for estimating an available time of a battery, and more particularly, to an apparatus and method for estimating an available time of a battery used in an electric vehicle or a hybrid vehicle in consideration of a driving pattern of a user and providing suitable information accordingly to the user.

BACKGROUND ART

Recently, with the active development of storage batteries, robots, satellites, and the like, along with the dramatically increasing demand for portable electronic products such as laptop computers, video cameras, mobile phones, and the like, research and development for high-performance secondary batteries capable of repeatedly charging and discharging has been actively made.

Currently, nickel-cadmium batteries, nickel-metal hydride batteries, nickel-zinc batteries, lithium secondary batteries, and the like are used as commercial secondary batteries. Among them, lithium secondary batteries have little to no memory effect in comparison with nickel-based secondary batteries, and thus lithium secondary batteries are gaining a lot of attention for their advantages of free charging/discharging, low self-discharging, and high energy density.

Particularly, with the steady exhaustion of carbon energy and increasing interest in the environment, the demand for hybrid vehicles and electric vehicles is recently gradually increasing all over the world including United States, Europe, Japan, and the Republic of Korea. Hybrid vehicles and electric vehicles are supplied with power for driving the vehicles from the charging/discharging energy of battery packs. Therefore, in comparison with vehicles powered by an engine alone, they have higher fuel efficiency and can eliminate or lessen the emission of pollutants, which adds to the appeal of hybrid vehicles and electric vehicles. Accordingly, research and development for vehicle batteries essential to hybrid vehicles and electric vehicles have intensified with gaining interest.

A battery not connected to an external power source such as an AC power are used in mobile devices such like a vehicle, which limits the available time of the battery. However, in the case that the available time of the battery is not properly predicted, a user may encounter great difficulties. For example, by improper prediction of the available time of the battery, a vehicle may stop in the middle of the road due to the battery discharging entirely.

In order to prevent the battery from abruptly discharging entirely due to the user not being able to properly predict the available time of the battery, a technique of estimating a residual capacity of the battery, namely the SOC (State Of Charge), and providing the information to a user is widely known in the art. The SOC of a battery generally represents a residual capacity as a percentage of FCC (Full Charge Capacity) of the battery. In order to estimate the SOC of a battery, various methods may be used; however, the most representative method is estimating the SOC by means of current integration. In the current integration, input/output currents of the battery are accumulated and added or subtracted to/from an initial capacity to obtain the SOC.

However, even if the SOC of a battery is estimated and provided to the user, the user may not accurately predict the available time of the battery. In other words, since the SOC represents a residual capacity to a user in the form of a percentage of the entire capacity of the battery, the user may not concretely determine the available time of the battery from the residual capacity information of the battery.

Particularly, even for batteries with the same SOC, depending on the habits and environments of the users, the available time of a battery may be different. For example, in the case of an electric vehicle, the available time of a battery may greatly vary depending on the driving habit of a user who frequently accelerates and abruptly brakes or the driving environment such as an uphill/downhill mountainous terrain.

However, according to the conventional technique, such situations are not considered at all, and in particular, a user may have difficulty predicting the accurate available time of a battery by just the SOC information.

DISCLOSURE

Technical Problem

The present disclosure is designed to solve the problems of the prior art, and therefore it is an object of the present disclosure to provide an apparatus and method for estimating a relatively accurate available time of a battery in consideration of driving patterns such as the habits and environments of a user using a battery.

Additional features of the invention will be set forth in the description which follows, and in part will be apparent from the description, or may be learned by practice of the invention.

Technical Solution

In one aspect of the present disclosure, there is provided an apparatus for estimating an available time of a battery, which includes a current measuring unit for measuring an output current of the battery; a SOC estimating unit for estimating the SOC (State Of Charge) of the battery; and a controller for estimating an available time of the battery by using a measured current value obtained by the current measuring unit, an estimated SOC value obtained by the SOC estimating unit and an entire capacity of the battery.

Preferably, the controller may estimate the available time of the battery by multiplying the entire capacity of the battery by the estimated SOC value and dividing the result value by the measured current value.

Also preferably, the controller may use an average value of currents measured during a predetermined period as the measured current value.

In another aspect of the present disclosure, there is also provided a battery pack, which includes the apparatus for estimating an available time of a battery as described above.

In another aspect of the present disclosure, there is also provided a vehicle, which includes the apparatus for estimating an available time of a battery as described above.

In another aspect of the present disclosure, there is also provided a method for estimating an available time of a battery, which includes: measuring an output current of the battery; estimating the SOC (State Of Charge) of the battery; and estimating an available time of the battery by using the measured current value, the estimated SOC value and an entire capacity of the battery.

Preferably, in the step of estimating an available time of the battery, the available time of the battery may be estimated by multiplying the entire capacity of the battery by the estimated SOC value and dividing the result value by the measured current value.

Also preferably, in the step of estimating an available time of the battery, an average value of currents measured during a predetermined period may be used as the measured current value.

Advantageous Effects

According to the present disclosure, since the battery use time, namely available time of a battery is relatively accurately predicted and provided to a user, this prevents any damages such as a battery unexpectedly discharging entirely during use and allows the user to change the battery at a suitable time before the battery discharges entirely.

Particularly, according to the present disclosure, the available time of the battery is predicted in consideration of a battery use pattern such as habits of a user who uses the battery or environments where the battery is used. For example, in the case of a battery for an electric vehicle, the available time of the battery may be predicted relatively accurately with approximation to reality by taking into consideration the driving habits or history of a user or the driving environment of the vehicle.

Moreover, according to an embodiment of the present disclosure, since the information such as nearby charge stations is provided to the user before the estimated available time of the battery lapses, it is possible to provide customized charge information suitable for each user. Further, since the charge information may be provided to a user by using a portable terminal such as a smart phone, the user may more conveniently receive various kinds of charge information.

DESCRIPTION OF DRAWINGS

Other objects and aspects of the present disclosure will become apparent from the following descriptions of the embodiments with reference to the accompanying drawings in which.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
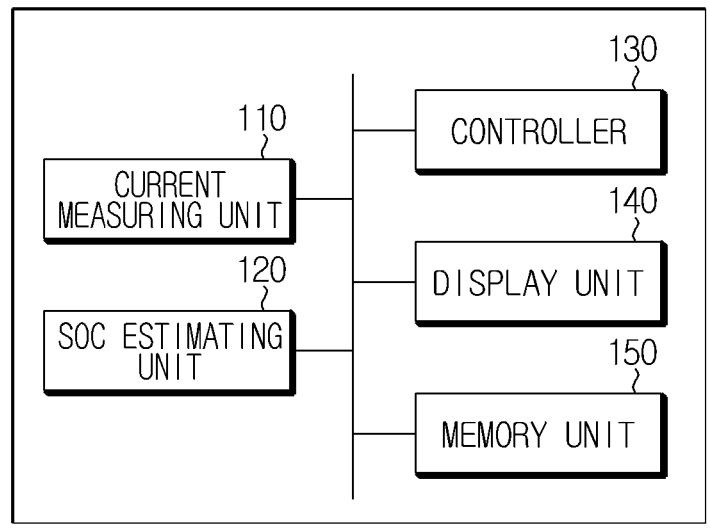
FIG. 1 is a block diagram schematically showing a functional configuration of an apparatus for estimating an available time of a battery according to an embodiment of the present disclosure.
Figure 2:
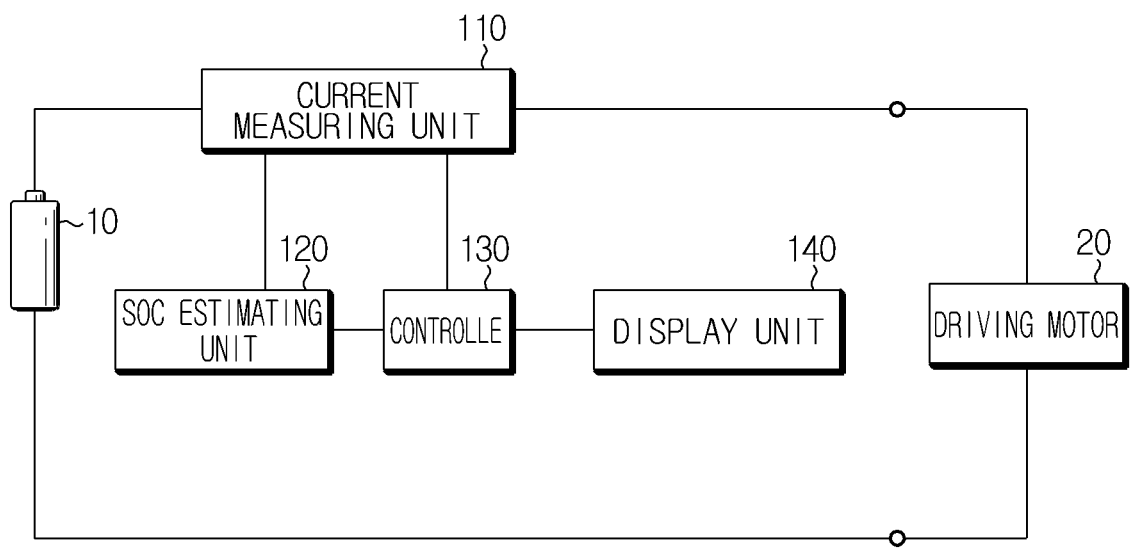
FIG. 2 is a schematic view showing the apparatus for estimating an available time of a battery according to an embodiment of the present disclosure, which is connected on a charge/discharge path of a battery for a vehicle.

FIG. 1 is a block diagram schematically showing a functional configuration of an apparatus for estimating an available time of a battery (or, a battery available time estimating apparatus) according to an embodiment of the present disclosure, and FIG. 2 is a schematic view showing the battery available time estimating apparatus according to an embodiment of the present disclosure, which is connected on a charge/discharge path of a battery for a vehicle.

Referring to FIGS. 1 and 2, a battery available time estimating apparatus according to the present disclosure includes a current measuring unit 110, a SOC estimating unit 120 and a controller 130.

The current measuring unit 110 measures a current charged to or discharged from a battery 10. Particularly, the current measuring unit 110 measures a current output from the battery 10. The battery 10 outputs a current to a load for power supply, and the current measuring unit 110 measures the current output from the battery 10 as described above. For example, referring to FIG. 2, in the case of an electric vehicle, as a current is output from the battery 10 and supplied to a driving motor 20, the driving motor 20 operates so that the electric vehicle may run. Here, when the current is output from the battery 10 to the driving motor 20, the current measuring unit 110 measures the output current value.

The current measuring unit 110 may measure the output current of the battery 10 periodically or non-periodically. In addition, the current measuring unit 110 may measure the output current of the battery 10 continuously or for only a certain period.

The current measuring unit 110 may be implemented in various ways. For example, the current measuring unit 110 may be implemented to measure a current by sensing a voltage applied to a sense resistor installed on a charge/discharge path. In addition, the current measuring unit 110 may also be implemented as a current measuring unit which is measured at a conventional battery pack protecting device to measure a current of the battery 10. In addition, various kinds of current measuring devices known in the art of the present disclosure may be used in the present disclosure.

The information of the output current of the battery 10, measured by the current measuring unit 110 as described above, may be transmitted to the controller 130 and used for estimating the available time of the battery 10. In addition, the output current value of the battery 10 may be transmitted to the SOC estimating unit 120 and used for estimating the SOC (State Of Charge) of the battery 10.

The SOC estimating unit 120 estimates the SOC of the battery 10. The SOC estimating unit 120 may estimate the SOC of the battery 10 in various ways, and the present disclosure is not limited to a specific pattern of the SOC estimating unit 120.

For example, the SOC estimating unit 120 may estimate the SOC of the battery 10 by using current integration, which receives information of the input/output currents of the battery 10 from the current measuring unit 110, integrates the input/output currents, and adds or subtracts the integrated input/output currents to/from an initial capacity. In addition, the SOC estimating unit 120 may estimate the SOC by measuring OCV (Open Circuit Voltage) of the battery 10 or impedance of the battery 10. In addition, various kinds of SOC estimating devices well known in the art of the present disclosure may be used as the SOC estimating unit 120 of the present disclosure, and the present disclosure is not limited to a specific implementation of the SOC estimating unit 120.

The controller 130 receives information of a measured current value from the current measuring unit 110 and the information of an estimated SOC value from the SOC estimating unit 120. In addition, the controller 130 estimates the available time of the battery 10 by using the measured current value and the estimated SOC value together with the entire capacity of the battery 10.

Here, the entire capacity of the battery 10 represents a capacity when the battery 10 is in a fully charged state, namely the maximum capacity of the battery 10 may be charged in the present situation, and may be expressed with the unit of Ah. The entire capacity of the battery 10 may be a value already known to the controller 130 or a value separately obtained at a certain time point by the controller 130 or another component. If the entire capacity of the battery 10 is separately obtained by the controller 130 or another component, the present disclosure is not limited to a specific method of obtaining an entire capacity of the battery 10 as described above, and various methods may be used for calculating an entire capacity of the battery 10.

Preferably, the controller 130 may estimate an available time of the battery 10 according to Equation 1 below.

$$\text{Available\_Time\_of\_Battery} = \text{Entire\_Capacity\_of\_Battery} \times \frac{\text{Estimated\_SOC\_Value}}{\text{Estimated\_Current\_Value}} \quad \text{Equation 1}$$

Referring to Equation 1, the controller 130 may estimate the available time of the battery 10 by multiplying the entire capacity of the battery 10 by the estimated SOC value and then dividing the result value by the measured current value. Here, as the estimated SOC value, a value converted with respect to each SOC when SOC 100% is assumed to be 1 may be used. For example, in a case where the estimated SOC is 40%, the estimated SOC value of Equation 1 may be substituted with 0.4.

In more detail, assuming that the entire capacity of the battery 10 is 100 Ah, the estimated SOC value obtained by the SOC estimating unit 120 is 30% and the measured current value is 4 A, the controller 130 may estimate the available time of the battery 10 as follows.

$$\text{Available\_Time\_of\_Battery} = 100 \text{ Ah} \times \frac{0.3}{4A} = 7.5 \text{ [h]}$$

In other words, the controller 130 may estimate that the available time of battery is 7.5 hours, namely 450 minutes. Therefore, if the battery 10 is a battery for an electric vehicle, the electric vehicle may be estimated as being capable of running about 7 hours and 30 minutes further.

As described above, the controller 130 according to the present disclosure uses a measured current value output from the battery 10 together with the SOC of the battery 10 in order to estimate the available time of the battery 10. Since the measured current value is obtained by measuring the current actually output from the corresponding battery 10, the measured current value may be regarded as reflecting the past history or use pattern of the battery 10. According to the present disclosure, since the measured current value is used to estimate the available time of the battery 10, it may also be regarded that the available time of the battery 10 is estimated in consideration of the habits and/or environments of the user. Therefore, according to the present disclosure, with the application of the user pattern of a user, available time of the battery may be estimated more accurately.

For example, it is assumed that two batteries 10 of the same kind having an entire capacity of 100 Ah are mounted to two electric vehicles C1 and C2 in a state where the SOC is 50% in both batteries, and the electric vehicles C1 and C2 are driven by drivers D1 and D2, respectively. If driver D1 frequently accelerates and brakes abruptly and driver D2 seldom accelerates and brakes abruptly, the measured current value of the battery 10 mounted to the electric vehicle C1 will be higher than the measured current value of the battery 10 mounted to the electric vehicle C2. As a more specific example, assuming that the battery 10 mounted to the electric vehicle C1 has a measured current value of 5 A and the battery 10 mounted to the electric vehicle C2 has a measured current value of 4 A, the available time of the batteries 10 mounted to the electric vehicles C1 and C2 may be calculated as follows.

$$\text{Available\_Time\_of\_Battery\_C1} = 100 \text{ Ah} \times \frac{0.5}{5A} = 10.0 \text{ [h]}$$

$$\text{Available\_Time\_of\_Battery\_C2} = 100 \text{ Ah} \times \frac{0.5}{4A} = 12.5 \text{ [h]}$$

Referring to the calculation results, the available time of the battery of the electric vehicle C1 will be 10 hours, and the available time of the battery of the electric vehicle C2 will be 12.5 hours. According to the calculation results, even though the battery 10 of the electric vehicle C1 and the battery 10 of the electric vehicle C2 have the same entire capacity, it can be understood that the available time of the electric vehicle C1 is shorter than the available time of the electric vehicle C2. This is because the current measured at the electric vehicle C1 is relatively high since the driver D1 of the electric vehicle C1 frequently accelerates and brakes abruptly. Therefore, in this aspect of the present disclosure, the available time of the battery 10 may be more accurately determined in consideration of a driving habit of a user who frequently accelerates and brakes abruptly.

In addition, in a case where a vehicle is driven in a mountainous terrain having many uphill and downhill roads, the current may be measured higher in comparison to vehicles driven in gentle terrains. Therefore, in the case of a vehicle frequenting mountainous terrains having many uphill and downhill roads, even though the battery 10 mounted to the vehicle has the same capacity and SOC as other vehicles, the available time of the battery measured may be relatively low (short). Therefore, in this aspect of the present disclosure, the available time of the battery 10 may be more accurately determined in consideration of driving environments or the like.

For this reason, according to the present disclosure, the available time of the battery 10 may be estimated more concretely and accurately in consideration of driving patterns of a user (driver) such as driving habits and driving environments.

Preferably, the controller 130 may use an average value of currents measured for a predetermined period as the measured current value for estimating the available time of the battery 10. Here, the predetermined period may be configured in various time units such as 10 minutes, 30 minutes and 1 hour. The controller 130 may estimate the available time of the battery 10 by using an average value of currents measured for a predetermined period, among currents measured by the current measuring unit 110.

Also preferably, the controller 130 may estimate the available time of the battery 10 by using a minimum or maximum value of currents measured for a predetermined period.

Figure 3:
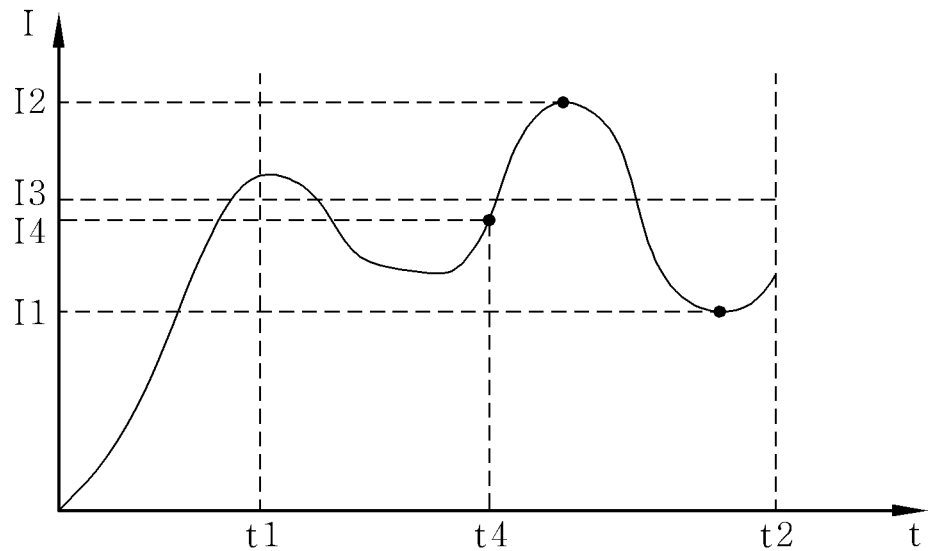
FIG. 3 is a graph showing an example of output currents of a battery, which are measured by a current measuring unit according to an embodiment of the present disclosure.

FIG. 3 is a graph showing an example of output currents of a battery, which are measured by the current measuring unit 110 according to an embodiment of the present disclosure.

As shown in FIG. 3, in a case where an output current of the battery 10 is measured by means of the current measuring unit 110, the measured current value may not be consistent but irregularly fluctuating. This is because the output current may be changed according to use conditions or states of the battery 10. For example, in case of a battery for an electric vehicle, the output current may change depending on whether an electric vehicle is accelerating or decelerating or whether the road is uphill or downhill.

The controller 130 uses the measured current value to calculate the available time of the battery 10. Here, in a case where the controller 130 calculates the available time of the battery 10 by using an equation such as Equation 1, the measured current value should be obtained as not a certain range but a specific value. Therefore, the controller 130 should select a specific current value under the situation where the current is varying.

At this time, the controller 130 may use an average value of currents measured for a predetermined period as the measured current value. For example, in the embodiment of FIG. 3, assuming that an average value of currents measured in a time period t1 to t2 is I3, the controller 130 may put the I3 into Equation 1 as the measured current value. As described above, in a case where an average value of currents measured for a predetermined period is used as the measured current value to estimate the battery available time, an average available time with a small margin of error may be obtained.

In addition, the controller 130 may use a minimum value of currents measured for a predetermined period as the measured current value. For example, in the embodiment of FIG. 3, I1 which is a minimum value of currents measured in a time period t1 to t2 may be put into the Equation 1 as the measured current value. In a case where the available time of the battery 10 is estimated by using a minimum value of measured output currents, the maximum available time of the battery 10 may be estimated.

In addition, the controller 130 may use a maximum value of currents measured for a predetermined period as the measured current value. For example, in the embodiment of FIG. 3, I2 which is a maximum value of currents measured in a time period t1 to t2 may be put into the Equation 1 as the measured current value. In a case where the available time of the battery 10 is estimated by using a maximum value of measured output currents, the minimum available time of the battery 10 may be estimated.

Moreover, the controller 130 may use any average value, a minimum value and a maximum value of currents measured for a predetermined period in order to estimate the available time of the battery 10. In other words, the controller 130 may estimate an average available time, a maximum available time and a minimum available time of the battery 10 by using the average value, the minimum value and the maximum value of currents measured for a predetermined period. In addition, the controller may provide information for extending the available time by using the maximum available time and the minimum available time. For example, a controller of an available time estimating device of a battery for an electric vehicle may propose an economic driving pattern to a driver in order to induce the extension of the available time of the battery.

In addition, the controller 130 may estimate the available time of the battery 10 by using a current value measured as a specific time point as the measured current value. For example, in the embodiment of FIG. 3, I4 which is a current value measured at a time point t4 may be used as the measured current value of Equation 1. The method of estimating the available time of the battery 10 by using a current value measured as a specific time point may be more useful for the case where the output current of the battery 10 rapidly changes.

Further, the controller may estimate the available time of the battery 10 by suitably mixing the current value measured at a specific time point with the average value, the minimum value or the maximum value of currents measured for a predetermined period. For example, in a situation where the output current of the battery 10 rapidly changes, the available time of the battery 10 may be estimated by using the current value measured at a specific time point, and in a situation where the output current of the battery 10 is somewhat stabilized, the available time of the battery 10 may be estimated by using the average value, the minimum value or the maximum value of currents measured for a predetermined period.

Meanwhile, even though FIG. 3 shows that the output current of the battery 10 is continuously measured and expressed as a curve, the output current of the battery 10 may also be measured discontinuously, for example periodically, and even in this configuration, the controller 130 may estimate the available time of the battery 10 as described above.

Preferably, the battery available time estimating apparatus may further include a display unit 140 as shown in FIGS. 1 and 2.

In a case where the available time of the battery is estimated by the controller 130, the display unit 140 displays the estimated available time of the battery to the user. Therefore, the display unit 140 may provide the available time of the battery to the user by using an output device such as an LCD monitor or a speaker. For example, the display unit 140 may be provided at or near a dashboard of the driver's seat in the battery 10 for an electric vehicle to provide the available time of the battery to the driver. Therefore, the driver may intuitively check the available running time of the vehicle through the display unit 140.

Further, in a case where the controller 130 estimates all the average available time, the minimum available time and the maximum available time of the battery 10, the display unit 140 may provide all of them to the user. For example, the display unit 140 employed in the apparatus for estimating an available time of the battery 10 for an electric vehicle may provide the user with the information of how long the vehicle can run on average, at maximum or at minimum. Therefore, the driver may check an available time of the vehicle in various ways by using the maximum available time, the minimum available time and the average available time provided as described above. In addition, since the information of the maximum available time and the minimum available time is provided, the driver may be induced to drive the vehicle more economically.

In addition, the display unit 140 may further display the estimated SOC value together with the available time of the battery. Since the estimated SOC value may be expressed in the form of a percentage as a ratio of a residual capacity of the battery to the entire capacity of the battery, if the estimated SOC value is displayed together with the available time of the battery to the user, the user may more easily check the availability of the battery 10.

Also preferably, the controller 130 may provide charge information of the battery 10 to the user. Here, the charge information of the battery 10 represents information of the charge of the battery 10 and may include at least one of charge request information, charge station information, charge time information and charge price information. For example, in case of a battery available time estimating device of the battery 10 for an electric vehicle, the controller 130 may request the driver to charge the electric vehicle at the time when the estimated available time of the battery 10 expires and may also provide the driver with information of nearby locations of battery charge stations and battery exchange stations, subsidiary facilities of the corresponding battery stations or the like.

Particularly, in a case where the controller 130 provides the user with the charge information of the battery 10 as described above, the charge information may be collected through a mobile communication network such as a 3G network, a wireless LAN (WiFi) network and a satellite communication network. In this case, the battery available time estimating apparatus may further include a transmission unit for exchanging data through the mobile communication network. For example, in case of an available time estimating device of the battery 10 for an electric vehicle, the controller 130 may select a nearby charge station before the estimated available time of the battery 10 expires, and request the information of the corresponding charge station through the transmission unit, for example request information of a charge price, the number of waiting vehicles, subsidiary facilities of the charge station and so on through the mobile communication network. After that, a specific server connected to the mobile communication network or a server of the corresponding charge station may transmit information of the charge station to the transmission unit of the battery available time estimating apparatus through the mobile communication network. Therefore, the controller 130 may provide the server with information of the corresponding charge station, received through the transmission unit.

Further, when providing the charge information, the controller 130 may use the display unit 140. In other words, the display unit 140 may display the battery charge information such as charge request information, information of battery charge or exchange stations, charge time information and charge price information to the user together with the available time of the battery.

In addition, besides the display unit 140, the controller 130 may provide the charge information through various devices possessed by the user. Particularly, since portable terminals such as smart phones are widely used, the controller 130 may provide the charge information to such portable terminals through a mobile communication network. For example, the controller 130 of the battery available time estimating apparatus for an electric vehicle may provide the information such as nearby charge or exchange stations, charge or exchange prices, the number of waiting vehicles or the like to a smart phone of the driver. In addition, the charge information may also be provided through other devices provided at the vehicle, for example a navigation device.

Meanwhile, the controller 130 may be implemented by BMS (Battery Management System). Here, the BMS represents a battery management device provided at a battery pack to control general charge/discharge operations of the battery 10. However, the present disclosure is not limited to such an implementation of the controller 130, and the controller 130 may also be configured separately from the BMS. In addition, the SOC estimating unit 120 may also be implemented by BMS.

In addition, as shown in FIG. 1, the battery available time estimating apparatus according to the present disclosure may further include a memory unit 150. The memory unit 150 may store various data required for each component of the battery available time estimating apparatus, namely the current measuring unit 110, the SOC estimating unit 120, the controller 130, the display unit 140 or the like to perform its function. For example, the memory unit 150 may store a program required for the controller 130 to estimate the available time of the battery 10 or the entire capacity of the battery 10. Even though it is depicted in the drawings that the memory unit 150 is provided separately from the controller 130 or other components, the memory unit 150 may also be configured integrally with other components such as the controller 130.

A battery pack according to the present disclosure includes the battery available time estimating apparatus as described above. At this time, the current measuring unit 110 and the SOC estimating unit 120 of the battery available time estimating apparatus according to the present disclosure may be implemented as a current measuring unit and a SOC estimating unit provided at a conventional battery pack. In addition, the controller 130 of the battery available time estimating apparatus according to the present disclosure may be implemented by a component such as BMS provided at a conventional battery pack. However, this is just one example, and the current measuring unit 110, the SOC estimating unit 120 and the controller 130 may also be different from components of a conventional battery pack.

In addition, a vehicle according to the present disclosure includes the battery available time estimating apparatus as described above. Particularly, the vehicle including the battery available time estimating apparatus according to the present disclosure may be an electric vehicle.

Figure 4:
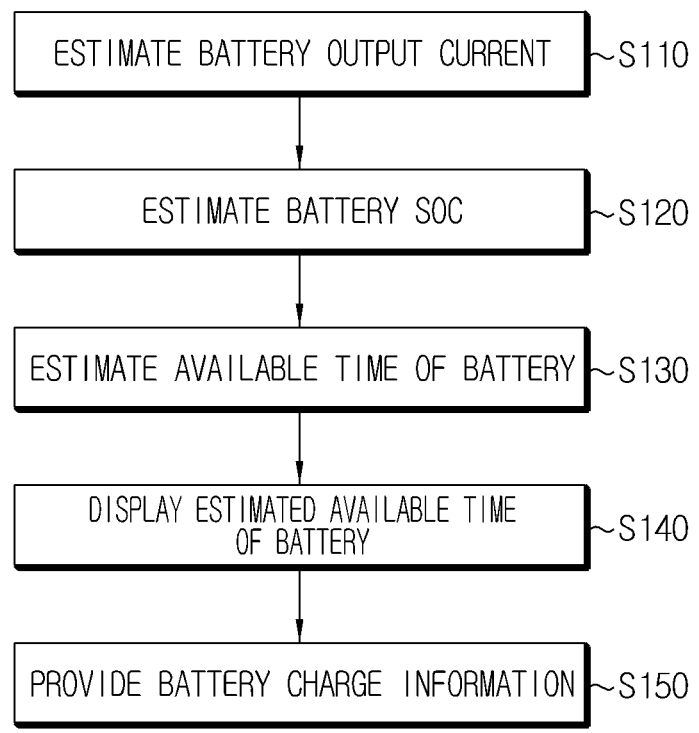
FIG. 4 is a schematic flowchart for illustrating a method for estimating an available time of a battery according to an embodiment of the present disclosure.

FIG. 4 is a schematic flowchart for illustrating a method for estimating available time of a battery according to an embodiment of the present disclosure. In FIG. 4, the subject which performs each step may be each component of the battery available time estimating apparatus as described above.

Referring to FIG. 4, in order to estimate the available time of the battery 10, an output current of the battery 10 is measured (S110), and a SOC of the battery 10 is estimated (S120). At this time, Steps S110 and S120 may be switched or may be performed simultaneously. How ever, in a case where the SOC of the battery 10 is estimated by current integration, since Step S120 may use a current value measured in Step S110, Step S110 is preferably performed prior to Step S120 at this time.

If the output current of the battery 10 is measured and the SOC of the battery 10 is estimated, an available time of the battery 10 is estimated by using an entire capacity of the battery 10 together with the measured current value and the estimated SOC value (S130). At this time, in Step S130, as shown in Equation 1, the available time of the battery 10 may be estimated by multiplying the entire capacity of the battery 10 by the estimated SOC value and dividing the result value by the measured current value.

In addition, in Step S130, an average value of currents measured for a predetermined period may be used as the measured current value to estimate the available time of the battery 10.

In addition, in Step S130, a maximum or minimum value of currents measured for a predetermined period may be used as the measured current value to estimate the available time of the battery 10.

Moreover, in Step S130, a current value measured at a specific time point may be used as the measured current value to estimate the available time of the battery 10.

In addition, the battery available time estimating method may further include displaying the available time of a battery estimated in Step S130 to the user, after Step S130, as shown in FIG. 4. Moreover, at this time, the estimated SOC value may also be displayed to the user together with the estimated available time of a battery.

In addition, the battery available time estimating method may further include providing the charge information of the battery 10 to the user, after Step S130, as shown in FIG. 4. Here, the charge information of the battery 10 may include at least one of charge request information, charge station information, charge time information and charge price information.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

Meanwhile, even though the term "unit" has been used in the specification, the term "unit" just represents a logic component and is not limited to a physically distinguishable component, as apparent to those skilled in the art.

What is claimed is:

1. An apparatus for estimating an available time of a battery, comprising:
   a current measuring unit configured to measure an output current of the battery;
   a State Of Charge (SOC) estimating unit configured to estimate an SOC of the battery; and
   a controller configured to estimate an available time of the battery by using the measured current value obtained by the current measuring unit, the estimated SOC value obtained by the SOC estimating unit and an entire capacity of the battery,
   wherein the controller estimates the available time of the battery by multiplying the entire capacity of the battery by the estimated SOC value at a predetermined time to determine a resultant value, and dividing the resultant value by any one of an average value, a minimum value and a maximum value of currents measured during a predetermined period.

2. The apparatus for estimating an available time of a battery according to claim 1, further comprising a display unit for displaying the battery available time estimated by the controller to a user.

3. The apparatus for estimating an available time of a battery according to claim 2, wherein the display unit further displays the estimated SOC value.

4. The apparatus for estimating an available time of a battery according to claim 1, wherein the controller provides charge information of the battery to a user.

5. The apparatus for estimating an available time of a battery according to claim 4, wherein the charge information of the battery includes at least one of charge request information, charge station information, charge time information and charge price information.

6. The apparatus for estimating an available time of a battery according to claim 1, wherein the controller is implemented by a Battery Management System (BMS).

7. A battery pack, which comprises an apparatus for estimating an available time of a battery as defined in claim 1.

8. A vehicle, which comprises an apparatus for estimating an available time of a battery as defined in claim 1.

9. A method for estimating an available time of a battery, comprising:
   measuring an output current of the battery;
   estimating a State Of Charge (SOC) of the battery; and
   estimating an available time of the battery by using the measured current value, the estimated SOC value and an entire capacity of the battery,
   wherein estimating the available time of the battery includes multiplying the entire capacity of the battery by the estimated SOC value at a predetermined time to determine a resultant value, and dividing the resultant value by any one of an average value, a minimum value and a maximum value of currents during a predetermined period.

10. The method for estimating an available time of a battery according to claim 9, after the step of estimating an available time of the battery, further comprising displaying the estimated available time of a battery to a user.

11. The method for estimating an available time of a battery according to claim 10, wherein the step of displaying the estimated available time of a battery further displays the estimated SOC value together with the estimated battery available time.

12. The method for estimating an available time of a battery according to claim 9, further comprising providing charge information of the battery to a user.

13. The method for estimating an available time of a battery according to claim 12, wherein the charge information of the battery includes at least one of charge request information, charge station information, charge time information and charge price information.

* * * * *